United States Patent
Mei

(10) Patent No.: US 8,896,373 B2
(45) Date of Patent: Nov. 25, 2014

(54) WIDEBAND DOHERTY AMPLIFIER NETWORK

(71) Applicant: Anaren, Inc., East Syracuse, NY (US)

(72) Inventor: Chong Mei, Jamesville, NY (US)

(73) Assignee: Anaren, Inc., East Syracuse, NY (US)

(*) Notice: Subject to any disclaimer, the term of this patent is extended or adjusted under 35 U.S.C. 154(b) by 71 days.

(21) Appl. No.: 13/792,275

(22) Filed: Mar. 11, 2013

(65) Prior Publication Data

US 2014/0253246 A1    Sep. 11, 2014

(51) Int. Cl.
*H03F 3/68* (2006.01)

(52) U.S. Cl.
CPC .................................. *H03F 3/68* (2013.01)
USPC ........................................ 330/124 R; 330/295

(58) Field of Classification Search
CPC .............. H03F 1/36; H03F 1/54; H03F 1/50; H03F 1/20; H03F 1/18; H03F 1/0288; H03F 3/24; H03F 3/60; H03F 3/68; H03F 3/211; H03F 3/601; H03F 3/602; H03F 3/604; H03F 3/605; H03F 3/607; H03F 3/3081; H03F 3/45475; H03F 2200/451; H03F 2200/198

USPC .................... 330/295, 124 R, 84, 286, 53–54
See application file for complete search history.

(56) References Cited

U.S. PATENT DOCUMENTS

2013/0093534 A1* 4/2013 Mei .............................. 333/125
2014/0118071 A1* 5/2014 Mei et al. ...................... 330/295

* cited by examiner

*Primary Examiner* — Hieu Nguyen
(74) *Attorney, Agent, or Firm* — Daniel P. Malley; Bond Schoeneck & King, PLLC

(57) ABSTRACT

The present invention is directed to an amplifier system that includes a main amplifier configured to amplify and a peak amplifier that operates only in a high power mode. An impedance matching network is coupled to at least the peak power amplifier. An impedance transformation device is coupled to at least a portion of the impedance matching network. The impedance transformation device is configured as a balun in the high power mode. The balun includes a first input and second input coupled to the main amplifier and the peak amplifier respectively. The impedance transformation device is configured as an unbalanced line impedance transformer in the low power mode because the predetermined output impedance substantially grounds the second input. The Doherty device is characterized by an impedance transformation ratio of at least 4:1 and a relative bandwidth greater than or equal to 40%.

23 Claims, 11 Drawing Sheets

WIDEBAND DOHERTY AMPLIFIER NETWORK

BACKGROUND OF THE INVENTION

1. Field of the Invention

The present invention relates generally to RF devices and networks, and particularly to RF impedance transformation networks.

2. Technical Background

As new RF spectrum becomes available to meet the ever increasing demand for wireless services market forces are requiring base stations to support a wider range of frequency bands. With respect to this requirement, the base station power amplifier as emerged as one of the key components. In particular, the problem of increasing the efficiency of linear power amplifiers for high peak-to-average ratio (PAR) signals in a linear power amplifier is one of the issues facing power amplifier manufacturers. After a suitable wideband power amplifier design is established, another design goal is develop generic platforms for the power amplifier design such that it can be deployed in a variety products with minimal or no change. As the added benefit of faster design cycles and lower development costs. It turns out that Doherty power amplifiers have been widely adopted as a linear amplifier configuration with improved efficiency for high PAR signals for a variety of reasons.

Referring to FIG. 1, in general, a Doherty power amplifier architecture 1 includes two amplifiers, a main amplifier 2 and a peak amplifier 3. The input signal to Doherty amplifier 1 is a differential signal that includes in-phase (I) and quadrature (Q) components. Briefly stated, the quadrature component is 90° out of phase with respect to the in-phase component. The main, or carrier amplifier 2, as it is sometimes called, amplifies the in-phase component (I). The peak amplifier 3 amplifies the quadrature component (Q) of the input signal. The main amplifier 2 is typically implemented as a Class B amplifier that operates over approximately 180° of an input signal's sinusoidal period. The peak amplifier 3, on the other hand, is implemented as a Class C amplifier that is biased to operate in only a portion of the operating region of the main amplifier 2. Thus, only the carrier amplifier 2 is operating in the "back off" mode, when the input signal power is relatively low; and the output impedance of the peak amplifier 3 is very high (e.g., 1000 Ohms).

The output of the main amplifier 2 is directed to an inverting impedance matching network 4, whereas the output of the peak amplifier is provided to non-inverting impedance matching network 5. The inverting matching networks 4 and non-inverting matching network 5 are the main amplifier's output matching network and the peak amplifier's output matching network, respectively. The inverting impedance matching network 4 transforms from an output impedance ($Z_1$) at one end (i.e., amplifier output 2) to a desired impedance ($Z_2$) at the other end (combining node 6) by keeping the product of $Z_1$ and $Z_2$ constant. For example, the output impedance $Z_1/2$ at would be transformed to $2*Z_2$. A quarter-wavelength transmission line is a common example of an inverting impedance matching network. As mentioned above, the peak amplifier 3 is coupled to the non-inverting impedance matching network 5 which is configured to transform impedance $Z_3$ at one end to $Z_4$ at the other end by keeping the ratio of $Z_3$ and $Z_4$ constant. For instance, $2*Z_3$ at one end would be transformed to $2*Z_4$ at the other end. One common example of a non-inverting impedance matching network includes two quarter-wavelength transmission lines. The reader should note that the subscripts (1, 2, 3, and 4) used with the various impedances (Z) in the above explanation are not meant to imply any impedance values, they are merely used as a mean to distinguish the various ends of the impedance networks. In the above description the reader should also note that the power amplifiers (2, 3) are treated as pure power sources, whereas the matching networks (4, 5) are deemed to include packaging, parasitic capacitors, and bias circuitry.

As mentioned above, when the amplifier is operating in maximum power mode, the (I, Q) signals are amplified by main and peak amplifiers before traversing their respective impedance matching networks (4, 5). The (I, Q) signals of course have the required phase and amplitude relationships, and summed at the combining node 6. The resultant common mode signal is directed into the output impedance transforming network 7. When Doherty amplifier 1 is operating in back off mode, the peak amplifier 3 is OFF and presents a high output impedance. The non-inverting impedance 5 matching network transforms the peak amplifier 3 path to a high impedance at the combining node. And the same time, the inverting impedance matching network 4 performs the load modulation by supplying the main amplifier 2 with a high impedance load. Accordingly, high efficiency is obtained in amplifier back off mode.

Referring to FIG. 2, an example of a conventional Doherty amplifier 1 is shown that includes the three matching networks described above. The inverting impedance network includes quarter-wavelength transmission lines TL1, Tl10 and TL5. The non-inverting matching network is includes quarter-wavelength transmission lines TL4 and TL12. After the combiner node, the output network includes a single quarter-wave transmission line TL11. The overall bandwidth of the Doherty amplifier 1 is limited by the frequency response of the three matching networks (4, 5 and 7). Conventional Doherty amplifiers are considered to be narrow bandwidth devices.

Referring to FIG. 3, a chart illustrating the performance of the conventional Doherty architecture shown in FIG. 2. The return loss of the conventional Doherty architecture in the back off mode (low power) only has a bandwidth between 1950 MHz-2050 MHz at about −20 dB return loss. Thus, the bandwidth is approximately 100 MHz at 2000 MHz and the relative bandwidth is of 5%. This is very narrow indeed.

There are several approaches that have been considered to improve the bandwidth of the conventional Doherty amplifier. These approaches typically involve decreasing the impedance at the combining node. The bandwidth improvement comes as the result of three things. First, designing the wideband inverting and non-inverting matching networks proves to be very difficult when the impedance transforming ratio is high. The bandwidth of inverting and non-inverting impedance matching networks is much easier to achieve when the impedance transforming ratio is relatively low. Second, when the Doherty amplifier is the back off mode, the undesired frequency dispersion in the peaking amplifier path has less impact on the bandwidth when it is coupled to a lower impedance node. Last, the effect of parasitical capacitances and bias networks are much smaller when transistors are matched to lower impedances. However, the burden of the required impedance transforming is shifted to the final output impedance transforming matching network after the combining node. In this case, a large impedance transforming ratio that exhibits wideband performance is required.

What is needed therefore is a Doherty network that overcomes the drawbacks associated with conventional systems. Moreover, a system is needed that provides more favorable efficiency and bandwidth choices that are achievable in conventional Doherty amplifiers.

SUMMARY OF THE INVENTION

The present invention addresses the needs described above by providing a Doherty network that overcomes the drawbacks associated with conventional systems. Moreover, a system of the present invention provides more favorable efficiency and bandwidth choices that can be achieved in conventional Doherty amplifiers.

One aspect of the present invention is directed to an amplifier system that includes a main amplifier configured to amplify an in-phase signal during a low power mode and a high power mode. A peak amplifier is configured to amplify a quadrature signal in the high power mode and present a predetermined output impedance is the low power mode. An impedance matching network is coupled to at least the peak power amplifier. An impedance transformation device is coupled to at least a portion of the impedance matching network. The impedance transformation device is configured as a balun in the high power mode. The balun includes a first input and second input coupled to the main amplifier and the peak amplifier respectively. The impedance transformation device is configured as an unbalanced line impedance transformer in the low power mode because the predetermined output impedance substantially grounds the second input. The Doherty device is characterized by an impedance transformation ratio of at least 4:1 and a relative bandwidth greater than or equal to 40%.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
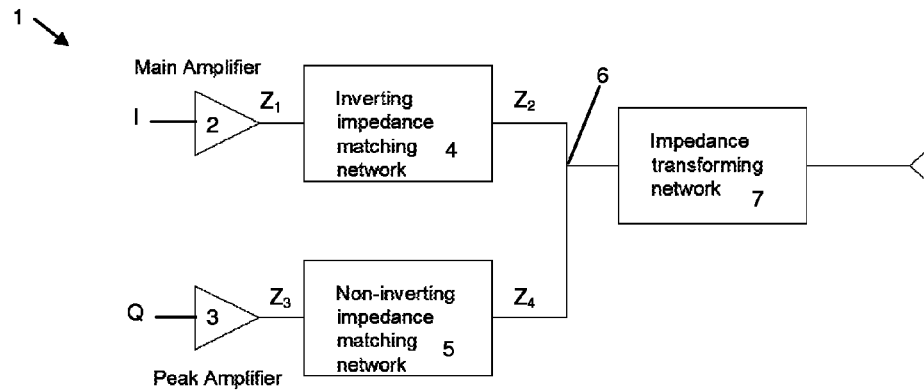
FIG. 1 is a general block diagram of a Doherty amplifier system.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the system of the present invention is shown in FIGS. 4A-5B, and is designated generally throughout by reference numeral 10.

In accordance with the invention, the present invention is directed to addressing the efficiency and bandwidth of a Doherty amplifier with a wideband matching and combining network having low insertion losses and implementable in a relatively small physical dimension. One aspect of the present invention provides a wide band impedance transformer to the output matching network of the amplifiers. In doing so, the main amplifier is connected to one differential port of the balun. The peak amplifier is connected to the other differential port. Both amplifiers are matched to the impedances at the differential ports of the balun. The present invention is thus designed with a high impedance transforming ratio (with very low impedance at differential ports) such that the requirement of the amplifier's matching network can be alleviated or eliminated.

The other aspect of the present invention are related to the operation of the Doherty networks. The main amplifier is coupled to the differential port through a non-inverting impedance matching network, or simply connects directly to the differential port. The peaking amplifier is coupled to the other differential port by an inverting impedance matching network, which most commonly is a simple quarter-wavelength transmission line transformer. This configuration provides the required Doherty operation and simplifies the amplifiers' matching network, while at the same time, vastly improving the bandwidth of the Doherty amplifier.

Figure 4A:
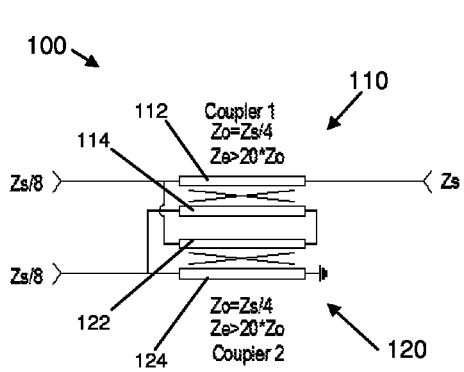
FIG. 4A is a diagrammatic depiction of a Doherty combiner device in accordance with one embodiment of the present invention.

As embodied herein, and depicted in FIG. 4A, a diagrammatic depiction of a Doherty combiner device 100 adapted in accordance with one embodiment of the present invention is disclosed. Doherty combiner device 100 includes a first coupler 110 and a second coupler 120. Each coupler (110, 120) is implemented using a pair of tightly coupled transmission lines with high even mode impedance. Doherty combiner device 100 functions a balun in normal condition. One of the differential ports 102 is connected to a transmission line 112 of coupler 110 and the second differential line 122 of coupler 120. The other differential ports 104 is connected to transmission line 114 of coupler 110 and the second differential line 124 of the coupler 120. The balun is configured to transform an impedance of Zs/8 at each of the differential ports (i.e., a differential impedance of Zs/4) to an impedance of Zs at the single ended output 106. The arrangement depicted in FIG. 4A is capable of achieving large impedance transforming ratios over a wide frequency range. Thus, the Doherty combiner device 100 depicted in FIG. 4A achieves a transforming ratio of 4:1 differentially using two couplers (110, 120). The arrangement depicted in FIG. 4A, does not only function as balun, by simply grounding one of the differential ports it becomes an impedance transformer.

Figure 4B:
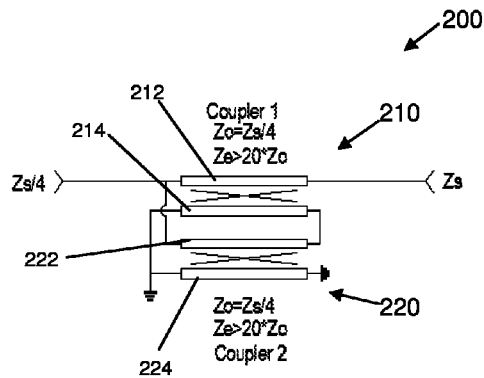
FIG. 4B is a diagrammatic depiction of an impedance transformer configuration based on the same Doherty combiner device of FIG. 4A.

Referring to FIG. 4B, a diagrammatic depicted of an impedance transformer 200 in accordance with another embodiment of the present invention is disclosed. Because the structure is configured to be an impedance transformer with one differential port grounded, this structure does not reap any benefit from the differential connection of FIG. 4A, and thus it transforms the impedance of Zs/4 at input 202 to an impedance of Zs at output 204.

Figures 5A, 5B:
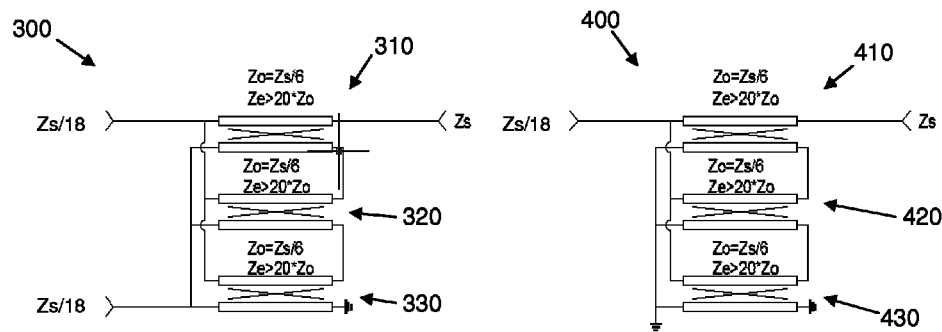
FIG. 5A is a diagrammatic depiction of another Doherty combiner device in accordance with one embodiment of the present invention.
FIG. 5B is a diagrammatic depiction of an impedance transformer based on the Doherty combiner device of FIG. 5A.

Referring to FIG. 5A, a diagrammatic depiction of another Doherty combiner device in accordance with one embodiment of the present invention is disclosed. In this embodiment, an improved impedance ratio is achieved by placing more transmission lines in parallel. For example, the Doherty combiner device 300 provides a 9:1 impedance transforming ratio by using three transmission line couplers (310, 320, and 330). Again the balun is implemented by using tightly coupled transmission lines that have compact physical dimensions and very low insertion loss.

Referring to FIG. 5B, a diagrammatic depiction of another impedance transformer in accordance with another embodiment of the present invention is disclosed. Again, the arrangement depicted in FIG. 5A does not only function as a balun, it also functions as an impedance transformer 400 by simply grounding one of the differential ports.

Figure 6:
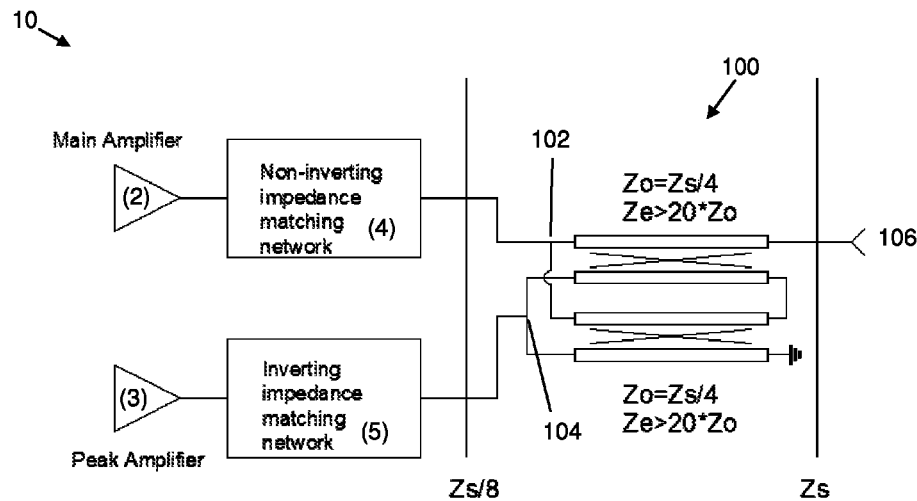
FIG. 6 is a Doherty amplifier system in accordance with one embodiment of the present invention.

As embodied herein and depicted in FIG. 6, a Doherty amplifier system in accordance with one embodiment of the present invention is disclosed. A Doherty amplifier system using the balun described above is shown in FIG. 6. As before, the I, Q signals are amplified by main amplifier 2 and the peak amplifier 3 before traversing their respective impedance matching networks (4, 5). Unlike the conventional systems, the outputs of the impedance matching networks (4, 5) are connected to the differential inputs of the Doherty combiner device 100 which is configured to combine them. As before, the inverting matching network 5 and non-inverting matching network 4 are configured to transform the intrinsic impedance of their respective transistors (2, 3) to the balun differential impedance. The odd-mode impedance of the couplers 110, 120 is Z/4 and thus, by virtue the differential inputs, the Z/8 impedance at the differential input is transformed to Z.

One aspect of the present invention uses the wide band impedance transforming property of Doherty combiner device 100 to provide the proper output matching for the amplifiers (2, 3). Moreover, Doherty combiner device 100 is able to transform the single-ended port impedance to differential ports with a large transforming ratio over a very wide frequency range. When the impedance of the differential ports is designed to match the low intrinsic impedance of the transistors (2, 3), the complexity of output matching network can be greatly reduced or even totally eliminated. Moreover, the undesired parasitic effects present in conventional systems are reduced in a low impedance system such as the present invention.

Figure 7:
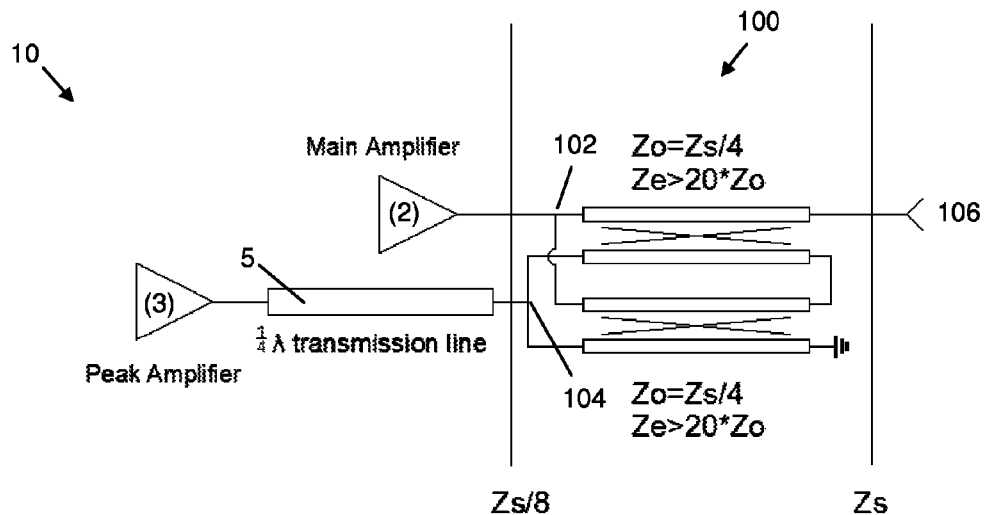
FIG. 7 is an example of a Doherty amplifier system in accordance with another embodiment of the present invention.

As embodied herein and depicted in FIG. 7, an example of a Doherty amplifier system 10 in accordance with another embodiment of the present invention is disclosed. Here, the main amplifier 2 is directly coupled to the differential port 102 without any intervening non-inverting impedance matching network. This represents a special case of a non-inverting impedance matching network that has a transforming ratio of 1. The peaking amplifier 3 is coupled to the other differential port via a simple quarter-wavelength transmission line 5 to provide a special case of an inverting impedance matching network with transforming ratio of 1. The importance of this feature is described below.

At the maximum power condition of a Doherty amplifier, the main and peak amplifiers (2, 3) are both turned on and output an equal amount of power. As described before, the input of the main amplifier 2 is an in-phase signal and the peak amplifier 3 requires a quadrature signal (i.e., one that has a 90 degrees phase delay). The quadrature signal is further delayed by the quarter wavelength transmission line 5 such that the signals provided to the differential ports (102, 104) are 180 degrees out of phase. Doherty combiner device 100 of the present invention combines the I, Q signals perfectly at the output port with required impedance transforming. In the low power mode (i.e., back off mode), the peak amplifier 3 presents a very high output impedance. By virtue of the quarter-wavelength transmission line 5, the differential port 104 is virtually grounded. As described above, when this port is grounded, Doherty combiner device 100 functions as an impedance transformer and doubles the impedance presented at the other differential port 102. The main amplifier 2, thru non-inverting impedance matching network or direct connection, is then loaded with an impedance that is twice the maximum power condition. And that is exactly the desired load pull-up in Doherty operation. This embodiment greatly simplifies the Doherty system 10 because it completely eliminates the need for an output matching network. Again, the bandwidth the Doherty amplifier architecture 10 of the present invention is greatly extended vis à vis the conventional approach. Like the previous embodiments, the system of the present invention features low insertion loss and a relatively small physical size.

Figure 8A:
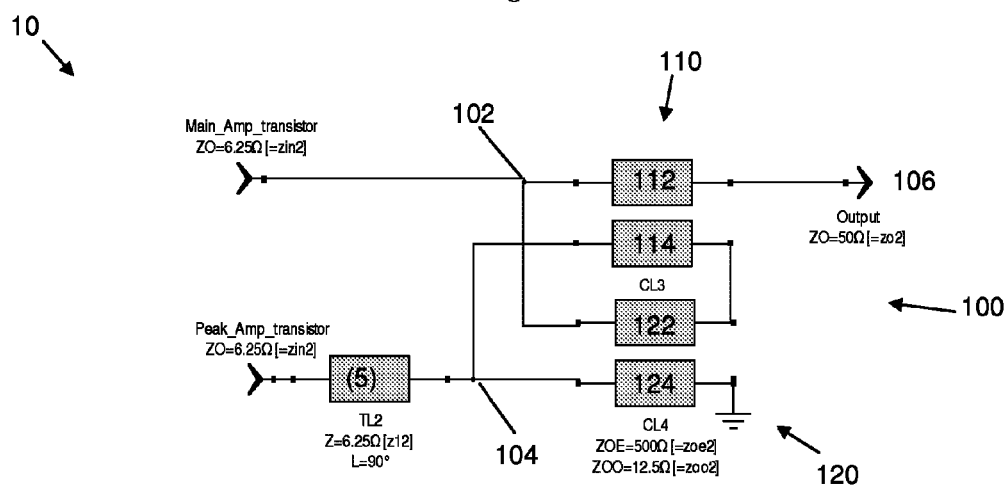
FIGS. 8A and 8B are schematic views of an example Doherty amplifier in accordance with the embodiment of FIG. 7.
Figure 8B:
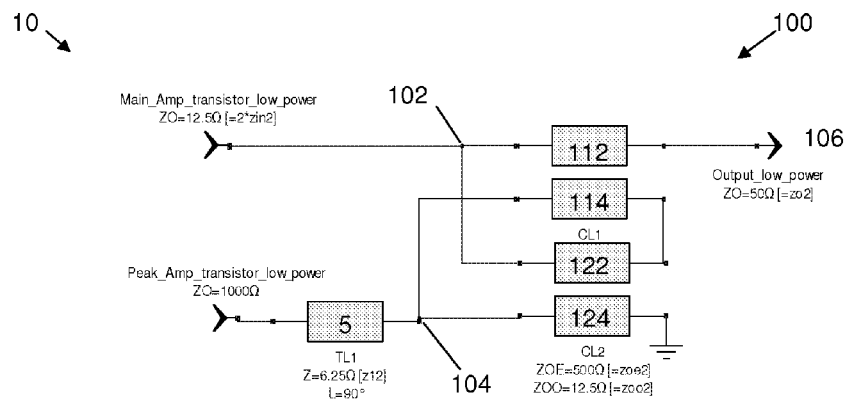

FIGS. 8A and 8B are example embodiments of the present invention that illustrate the bandwidth improvements provided by the present invention and, in particular, the embodiment of FIG. 7. FIG. 8A is directed to the peak power mode, whereas FIG. 8B is directed to the low power mode when the peaking amplifier 3 is turned OFF. In this example, a 2 GHz amplifier that employs a typical high power GaN transistor having an optimum output matching impedance or intrinsic impedance of 6.25 ohms is depicted. As before, the Doherty combiner device 100 includes a first coupler 110 and a second coupler 120. The odd mode impedance of the couplers is 12.5 Ohms. The Doherty combiner device 100 is a 4:1 device that transforms 6.25 ohm at each of the differential ports (102, 104) to a 50 ohm single ended port. When the Doherty amplifier is operating a maximum output power condition as shown in FIG. 8A, both the main amplifier 2 and the peak amplifier 3 are in saturation. Conversely, when the system is operating in the low power condition (FIG. 8B), the main amplifier 2 is operating, but not the peak power amplifier. Thus, the output impedance of the peak amplifier is set a high value (1,000

Ohms) Again the Doherty combiner device 100 is implemented by using tightly coupled transmission lines that have compact physical dimensions and very low insertion loss.

Figure 2:
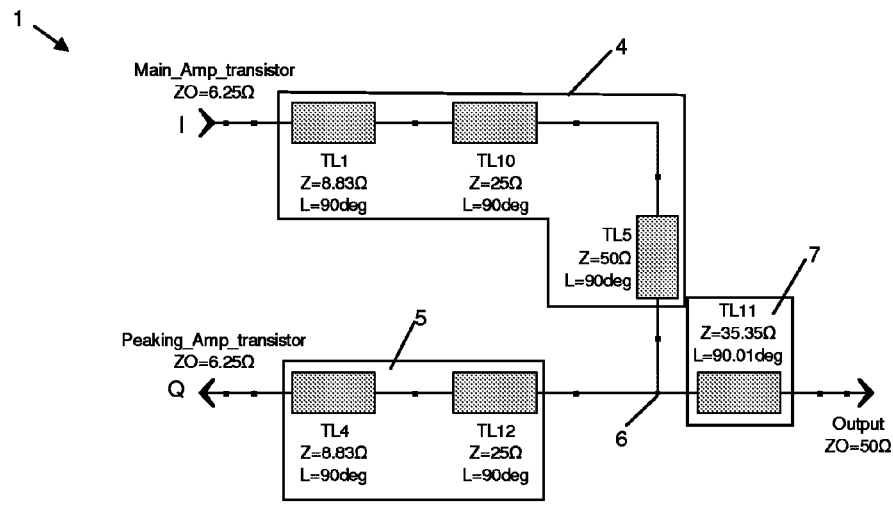
FIG. 2 is a more detailed diagrammatic depiction of a conventional Doherty system.
Figure 3:
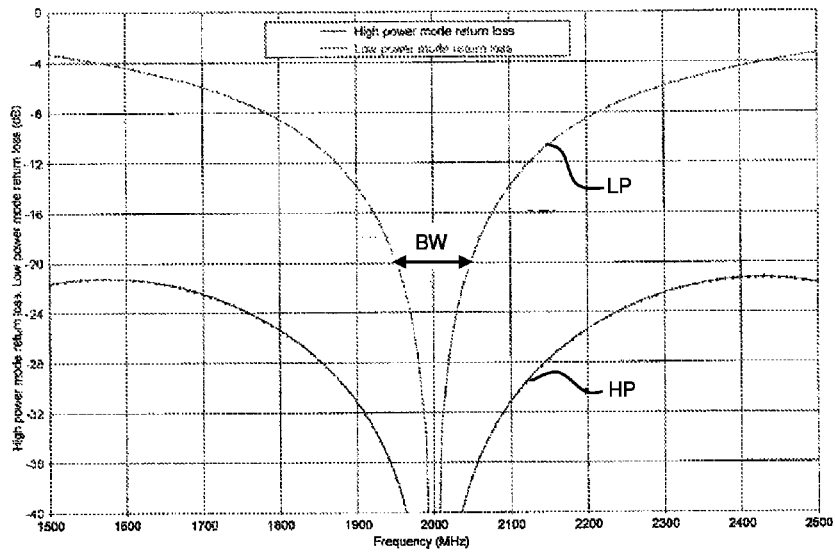
FIG. 3 is a chart illustrating the performance of the conventional Doherty architecture shown in FIG. 2.
Figure 9:
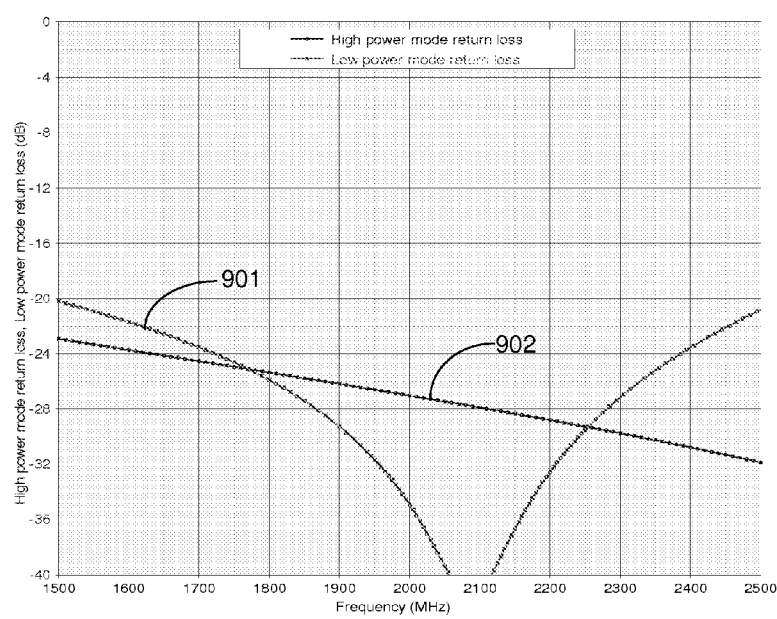
FIG. 9 is a chart that illustrates the performance of the Doherty architecture depicted in FIGS. 8A and 8B.

Referring to FIG. 9, a chart illustrating the performance of the Doherty architecture depicted in FIGS. 8A and 8B is disclosed. In particular, the chart shows the bandwidth of the system as a function of return loss at the combining port during both the high power condition and the low power condition. In this example, the bandwidth is defined as less than −20 dB return loss. In both lower power mode 901 and maximum power mode 902, the return loss of the presented Doherty architecture bandwidth is more than 1500 MHz-2500 MHz. Stated differently, the bandwidth is greater than 1000 MHz at 2000 MHz and the relative bandwidth is over 50%. At this point, it is helpful to compare the plot of FIG. 9 to the plot of FIG. 3 (the chart illustrating the performance of the conventional Doherty architecture shown in FIG. 2) Note that the transistor impedances are identical in both instances, and thus, the results can be compared directly. Namely, the return loss of the conventional Doherty architecture only has a bandwidth between 1950 MHz-2050 MHz, i.e., the bandwidth is approximately 100 MHz at 2000 MHz and the relative bandwidth is of 5%. In contrast, the present invention offers a bandwidth improvement that is greater than ten vis a vis the conventional scheme (i.e., 1000 to 100 Mhz at the center frequency of 2,000 MHz).

Figure 10A:
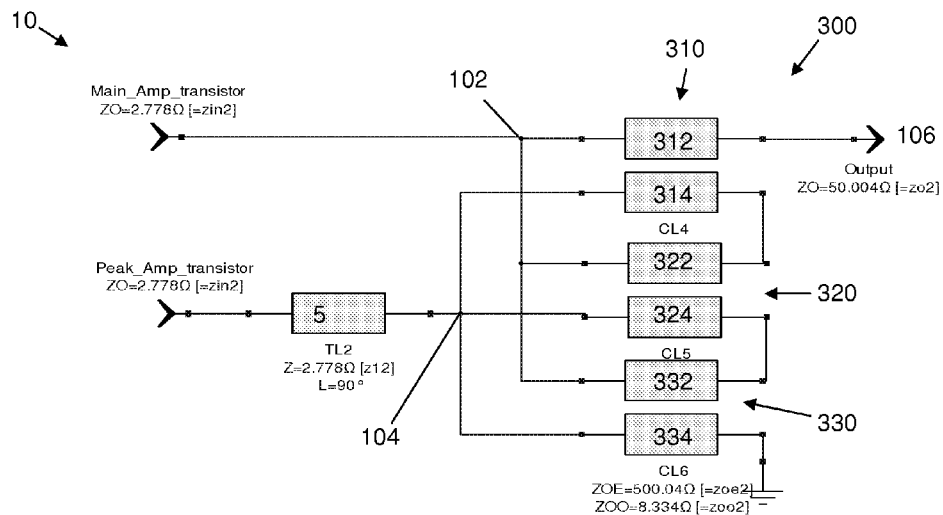
FIGS. 10A-10B are example embodiments of the Doherty amplifier system in accordance with yet another embodiment of the present invention.
Figure 10B:
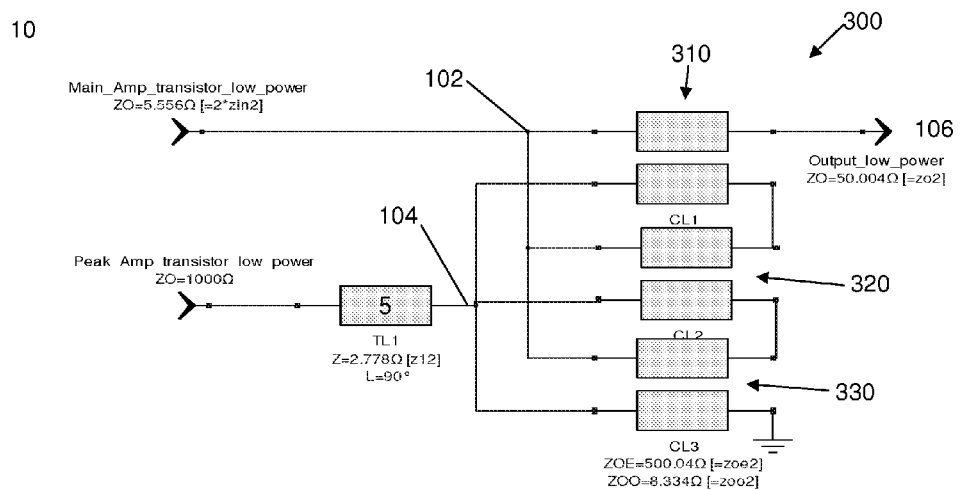

As embodied herein and depicted in FIGS. 10A-10B, example embodiments of the Doherty amplifier system in accordance with yet another embodiment of the present invention are disclosed. FIG. 10A is directed to the peak power mode, whereas FIG. 10B is directed to the low power mode when the peaking amplifier 3 is turned OFF. This embodiment of the present invention leverages the structure depicted in FIGS. 5A and 5B. Thus, in FIG. 10B when the system is in low power mode, the peaking amplifier presents an impedance of about 1000 Ohms, effective grounding node 104. The structure of FIGS. 10A-10B can be employed when the amplifier transistors (2, 3) have lower then optimum output matching impedances. For example, the output impedances of the amplifiers in this case is 2.78 Ohms. The balun of the present invention may be adapted to accommodate these values by applying a larger impedance ratio such as 18:1 (9:1 differentially). Again the Doherty combiner device 100 and impedance transformer 200 are implemented by using tightly coupled transmission lines that have compact physical dimensions and very low insertion loss.

Figure 11:
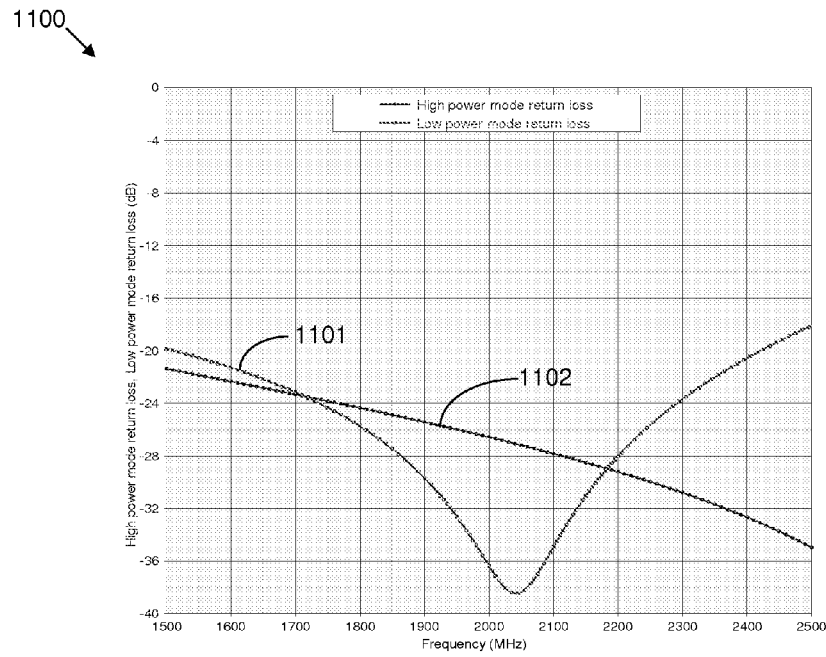
FIG. 11 is another chart that illustrates the performance of the Doherty architecture depicted in FIGS. 10A-10B.

Referring to FIG. 11, a chart that illustrates the performance of the Doherty architecture depicted in FIGS. 10A-10B is disclosed. The plot of the low power mode 1101 exhibits a −20 dB return loss at 1500 MHz and also at about 2400 Mhz. Thus, the impedance transformation ratio is increased to 9:1, while at the same time, demonstrating a relative bandwidth of 40%. This represents a significant improvement over the conventional Doherty architecture depicted in FIGS. 2-3.

Figure 12A:
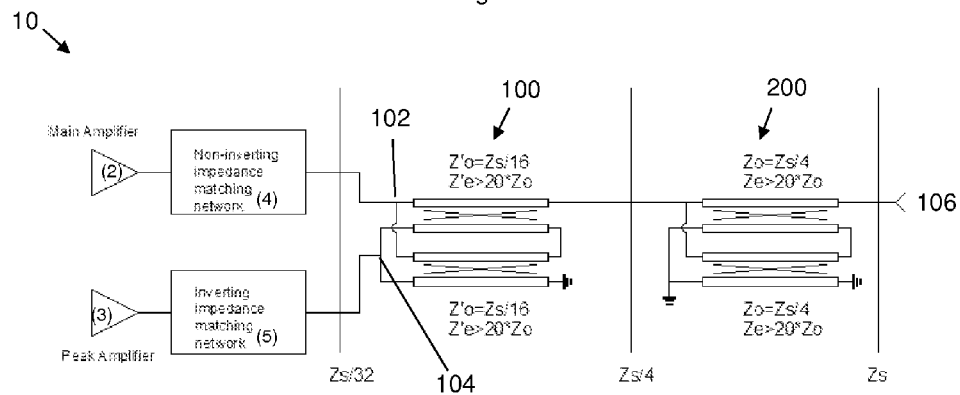
FIGS. 12A-12B are example embodiments of the Doherty amplifier system in accordance with yet another embodiment of the present invention.
Figure 12B:
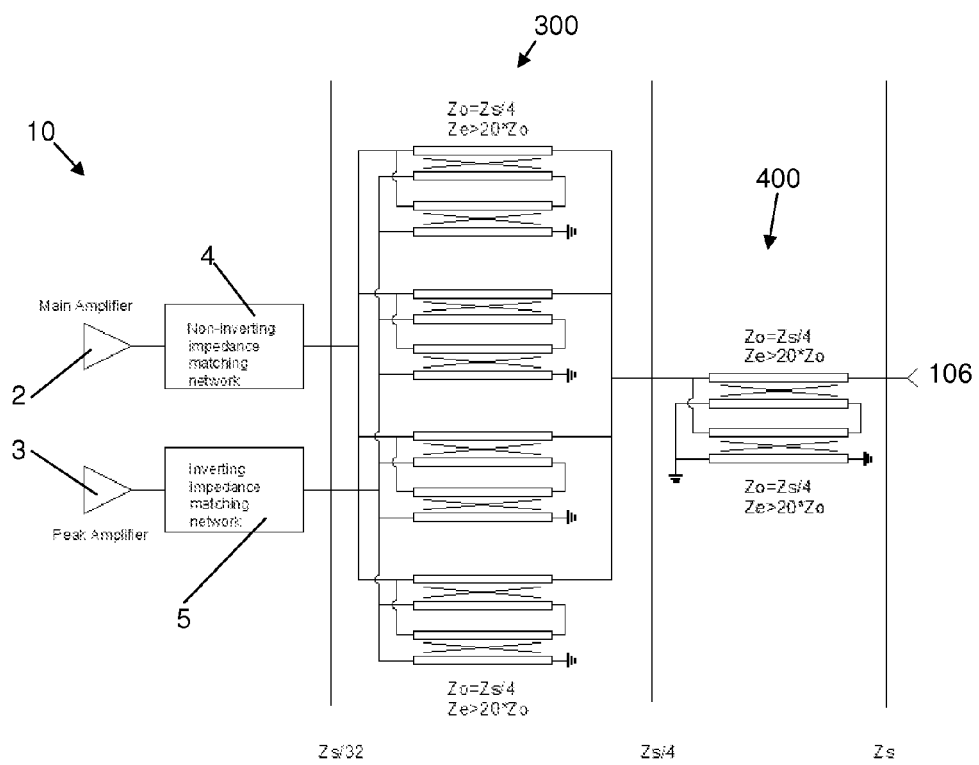

As embodied herein and depicted in FIGS. 12A-12B, example embodiments of the Doherty amplifier system in accordance with yet other embodiments of the present invention are disclosed. In FIG. 12A, the Doherty combiner device 100 (depicted in FIG. 4A) is cascaded with the impedance transformer 200 (depicted in FIG. 4B). In this embodiment, very low matching impedances are supplied to the transistor output. This embodiment is particularly useful for high power implications, where the intrinsic impedances of the power amplifier transistors are very low. This embodiment demonstrates an impedance transforming ratio of 32:1 (16:1 differentially). In this embodiment, the Doherty combiner device 100 couplers exhibit an odd mode impedance of Zs/16 and transform the impedance from Zs/32 to Zs/4 (8:1). The impedance transformer 200 completes the task by transforming the impedance from Zs/4 to the system impedance Zs (4:1). In FIG. 12B, the same impedance transformation can be provided by cascading the Doherty combiner device 100 of same impedance (See FIG. 4) in parallel.

Figure 13:
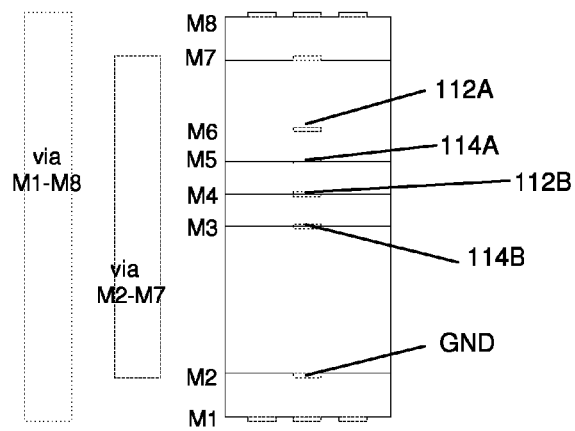
FIG. 13 is a diagrammatic depiction of the cross-section of an integrated circuit implementing the Doherty Combiner device depicted in FIGS. 4A-4B.

Referring to FIG. 13, a diagrammatic depiction of the cross-section of an integrated circuit implementing the Doherty Combiner device depicted in FIGS. 4A-4B is shown. Note the transmission lines 112 and 114 are implemented using layers 112A and 112B, and 114A and 114B, respectively. The reasons for this will become apparent below.

Figure 14A:
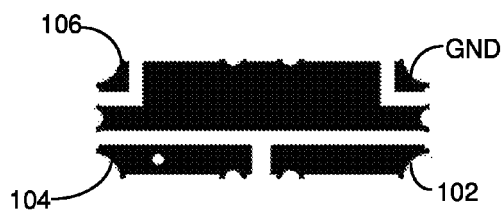
FIGS. 14A-14J show the various layers of the IC shown in FIG. 13.
Figure 14B:
Figure 14C:
Figure 14D:
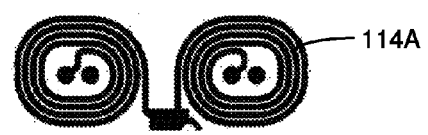
Figure 14E:
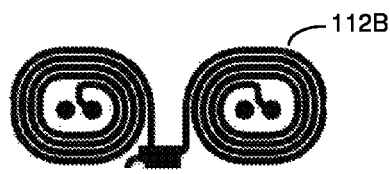
Figure 14F:
Figure 14G:
Figure 14H:
Figure 14I:
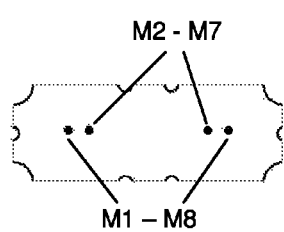
Figure 14J:
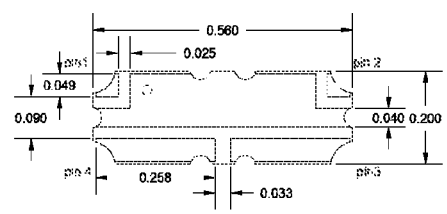

In reference to FIGS. 14A-14J, the various layers of the IC shown in FIG. 13 are shown. FIG. 14A shows the footprint of the device 100. The differential ports (102, 104) and the combination port 106 are implemented as shown. The couplers 110 and 120 are implemented as shown in FIGS. 14C-14F. The transmission line 112 is implemented in two layers, 112A and 112B. One reason for this relates to the even mode impedance. In order to obtain the desired impedance transformation, the even mode impedance should be as high as possible, at least (20) ($Z_{odd}$). This is achieved by limiting the influence of the ground plane (FIG. 14B) on the couplers. Thus, the distance between the ground plane (M2) and the couplers (M3-M6) is made as great as possible. See FIG. 13. This distance is also increased by dividing the coupler transmission lines into two layers. The design equations for an N coupler Doherty Combiner device are as follows. When impedance transforming $Zs/(N^2)$ to Zs, one needs to obtain an odd mode impedance Zs/(2N) and an even mode impedance as high as possible, at least 20*Zodd, as noted above.

Figure 15:
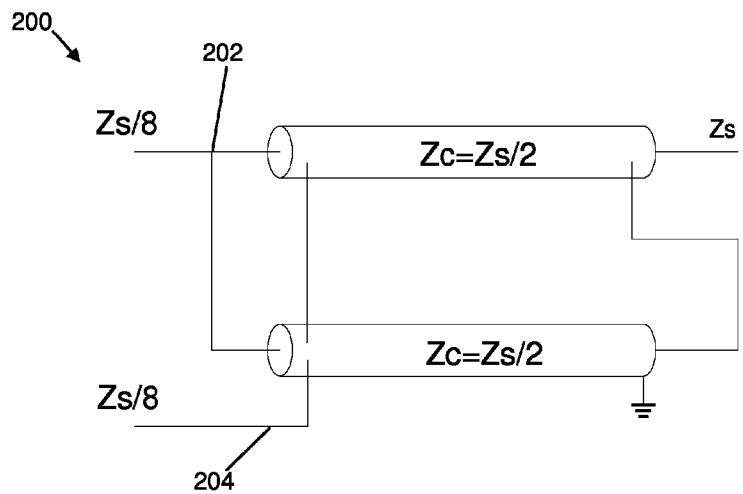
FIG. 15 is schematic view of the Doherty combiner device in accordance with yet another embodiment of the present invention.
Figure 16:
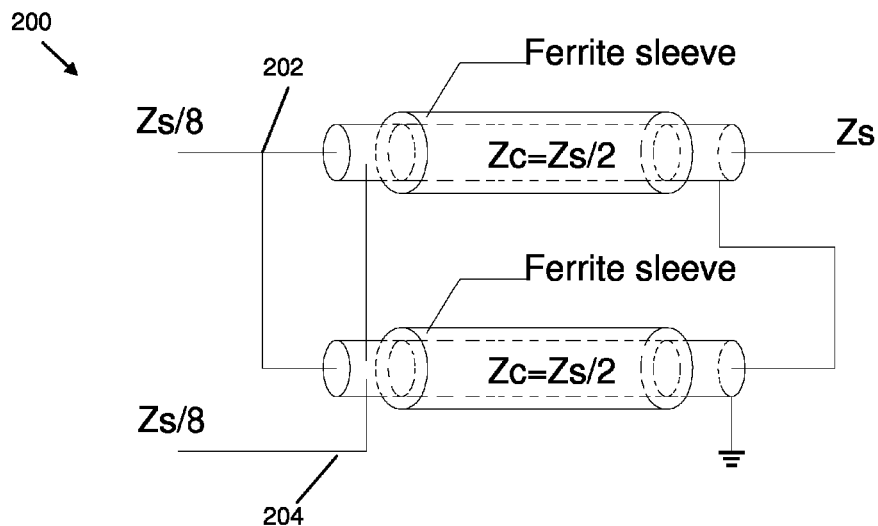
FIG. 16 is schematic view of the Doherty combiner device in accordance with yet another embodiment of the present invention.

Referring to FIG. 15, a schematic view of the Doherty combiner device 200 in accordance with yet another embodiment of the present invention is disclosed. In a lower frequency embodiment (See FIGS. 15-16), coaxial cables can be employed. As one skilled in the art will appreciate, a coaxial cable includes a central conductor surrounded by a dielectric material and a metallic sheath, and thus functions as a coupler device. Like in the previous embodiments, the differential port becomes virtually grounded when the peaking amplifier is turned OFF such that the device 200 is automatically changed from a balun to an impedance transformer. 204 For N coax cables, when impedance transforming $Zs/(N^2)$ to Zs, the characteristic impedance must be Zs/N, with the transmission line disposed or shielded from ground as far as possible. FIG. 16 is schematic view of the Doherty combiner device in accordance with yet another embodiment of the present invention. FIG. 16 is almost identical to FIG. 15 with the exception that ferrite sleeves are disposed around the coaxial cables. The ferrite sleeves shield the transmission lines from ground for the reasons stated above.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed:

1. An amplifier system comprising:
   a main amplifier configured to amplify an in-phase signal during a low power mode and a high power mode, and a peak amplifier configured to amplify a quadrature signal in the high power mode and present a predetermined output impedance is the low power mode;
   an impedance matching network coupled to at least the peak power amplifier; and
   an impedance transformation device coupled to at least a portion of the impedance matching network, the impedance transformation device being configured as a balun in the high power mode, the balun including a first input and second input coupled to the main amplifier and the peak amplifier respectively, the impedance transformation device being configured as an unbalanced line impedance transformer in the low power mode whereby the predetermined output impedance substantially grounds the second input, the Doherty device being characterized by an impedance transformation ratio of at least 4:1 and a relative bandwidth greater than or equal to 40%.

2. The system of claim 1, wherein the impedance transformation device includes a first coupler having a first transmission line and a second transmission line, and at least one second coupler having at least one third transmission line and at least one fourth transmission line, the first transmission line and the at least one third transmission line being coupled in parallel to the main amplifier, and the second transmission line and the at least one fourth transmission line being coupled in parallel to the peak amplifier in peak power mode and substantially grounded in low power mode in response to the predetermined output impedance.

3. The system of claim 2, wherein the first coupler and the at least one second coupler are implemented using a pair of tightly coupled transmission lines.

4. The system of claim 2, wherein the even mode impedance is proportional to the system impedance times at least one multiple of (10) ten.

5. The system of claim 4, wherein the even mode impedance is substantially equal to the system impedance times 50 (fifty).

6. The system of claim 2, wherein the odd mode impedance is less than or equal to the impedance transformation ratio.

7. The system of claim 2, wherein the at least one second coupler includes a second coupler and a third coupler.

8. The system of claim 7, wherein the second coupler includes a third transmission line and a fourth transmission line, and the third coupler includes a fifth transmission line and a sixth transmission line, the first transmission line, the third transmission line and the fifth transmission line being coupled in parallel to the main amplifier.

9. The system of claim 8, wherein the second transmission line, the fourth transmission line and the sixth transmission line are coupled in parallel to the peak amplifier in peak power mode and substantially grounded in low power mode in response to the predetermined output impedance.

10. The system of claim 8, further comprising a second unbalanced line impedance transformer coupled in series with the impedance transformation device.

11. The system of claim 10, wherein the second unbalanced line impedance transformer includes a second-first coupler coupled in series with the first transmission line, the third transmission line and the fifth transmission line, and a second-second coupler disposed in parallel with the second first coupler.

12. The system of claim 11, wherein the impedance transformation ratio is at least 32:1.

13. The system of claim 2, further comprising a second unbalanced line impedance transformer coupled in series with the impedance transformation device.

14. The system of claim 13, wherein the second unbalanced line impedance transformer includes a second-first coupler coupled in series with the first transmission line and a second-second coupler disposed in parallel with the second first coupler.

15. The system of claim 13, wherein the impedance transformation ratio is at least 32:1.

16. The system of claim 2, wherein the first coupler and the at least one second coupler are implemented using a pair of coaxial cables.

17. The system of claim 1, wherein the impedance matching network coupled to the peak power amplifier is a quarter wave transmission line.

18. The system of claim 17, wherein the main amplifier is coupled directly to the first input.

19. The system of claim 18, wherein the impedance transformation ratio is unity.

20. The system of claim 18, wherein the impedance transformation ratio is at least 4:1.

21. The system of claim 18, wherein the relative bandwidth is at least 50%.

22. The system of claim 17, wherein the second coupler includes a third transmission line and a fourth transmission line, and the third coupler includes a fifth transmission line and a sixth transmission line, the first transmission line, the third transmission line and the fifth transmission line being coupled in parallel to the main amplifier.

23. The system of claim 22, wherein the second transmission line, the fourth transmission line and the sixth transmission line are coupled in parallel to the peak amplifier in peak power mode and substantially grounded in low power mode in response to the predetermined output impedance.

* * * * *